United States Patent
Wang et al.

(10) Patent No.: US 12,278,636 B2
(45) Date of Patent: Apr. 15, 2025

(54) RECEIVER CIRCUIT WITH AUTOMATIC DC OFFSET CANCELLATION IN DISPLAY PORT APPLICATIONS

(71) Applicant: PARADE TECHNOLOGIES, LTD., San Jose, CA (US)

(72) Inventors: Hongquan Wang, Shanghai (CN); Shengyuan Zhang, Shanghai (CN); Qing Chen, Nanjing (CN); Liang Xu, Shanghai (CN); Kochung Lee, San Jose, CA (US)

(73) Assignee: PARADE TECHNOLOGIES, LTD., San Jose, CA (US)

( * ) Notice: Subject to any disclaimer, the term of this patent is extended or adjusted under 35 U.S.C. 154(b) by 0 days.

(21) Appl. No.: 18/070,283

(22) Filed: Nov. 28, 2022

(65) Prior Publication Data
US 2024/0178826 A1 May 30, 2024

(51) Int. Cl.
*H03K 5/24* (2006.01)
*G09G 5/00* (2006.01)
*H03H 7/06* (2006.01)

(52) U.S. Cl.
CPC .............. *H03K 5/24* (2013.01); *G09G 5/006* (2013.01); *H03H 7/06* (2013.01); *G09G 2370/00* (2013.01)

(58) Field of Classification Search
CPC ...... H04B 1/1615; H03K 4/50; H03K 3/0231; H03K 3/011; H03F 3/19; H03F 2200/451; H03F 2200/06; H03F 2200/102
See application file for complete search history.

(56) References Cited

U.S. PATENT DOCUMENTS

| | | | |
|---|---|---|---|
| 6,496,721 B1 * | 12/2002 | Yonce ...................... | A61B 5/30 600/509 |
| 8,502,584 B1 * | 8/2013 | Dong ....................... | H04B 3/30 375/219 |
| 8,896,377 B1 * | 11/2014 | Shrestha ............. | H04L 25/0276 381/120 |
| 9,065,480 B1 * | 6/2015 | Tseng .................... | H03M 3/388 |
| 10,797,608 B2 * | 10/2020 | Liu .................... | H02M 3/33523 |
| 2002/0030542 A1 * | 3/2002 | Yasukouchi .......... | H03F 3/3023 330/288 |

(Continued)

FOREIGN PATENT DOCUMENTS

KR 20160089233 A * 7/2016

*Primary Examiner* — Quan Tra
(74) *Attorney, Agent, or Firm* — Morgan, Lewis & Bockius LLP

(57) ABSTRACT

This application is directed to a data interface having an input interface for receiving a differential input signal and a reference interface for providing a predefined reference voltage. A high pass filter is coupled to the input interface, and configured to filter the differential input signal and generate a filtered differential input signal. A differential integrator is coupled to the high pass filter and reference interface, and configured to receive the filtered differential input signal and generate a differential output signal including a first output signal and a second output signal. Each of the first and second output signals has a common mode output voltage substantially equal to the predefined reference voltage. In some embodiments, the data interface includes a connector including a plurality of data lanes and a pair of command pins that are distinct from the data lanes and coupled to the input interface.

18 Claims, 6 Drawing Sheets

(56) References Cited

U.S. PATENT DOCUMENTS

| | | | |
|---|---|---|---|
| 2002/0175739 A1* | 11/2002 | Sidiropoulos | H03F 3/4565 |
| | | | 327/345 |
| 2009/0189672 A1* | 7/2009 | Yang | G06G 7/18 |
| | | | 327/344 |
| 2012/0139609 A1* | 6/2012 | Putter | G06G 7/18 |
| | | | 327/337 |
| 2013/0033322 A1* | 2/2013 | Balm | H03F 3/193 |
| | | | 327/542 |
| 2013/0301690 A1* | 11/2013 | Shrestha | H04L 27/06 |
| | | | 375/340 |
| 2014/0375385 A1* | 12/2014 | Miyazawa | H03F 1/0211 |
| | | | 330/253 |
| 2015/0168991 A1* | 6/2015 | Sengoku | G06F 1/04 |
| | | | 713/600 |
| 2019/0158133 A1* | 5/2019 | Wang | H04B 1/1615 |
| 2019/0363686 A1* | 11/2019 | Grasso | H03F 3/45188 |
| 2022/0311393 A1* | 9/2022 | Shen | H03F 3/217 |

* cited by examiner

RECEIVER CIRCUIT WITH AUTOMATIC DC OFFSET CANCELLATION IN DISPLAY PORT APPLICATIONS

TECHNICAL FIELD

This application relates generally to data interfaces, including but not limited to, methods, devices, and systems for automatically cancelling offset voltages in a receiver circuit of a display port.

BACKGROUND

Digital display interfaces are applied to transmit video, audio, or other device management and device control data between video sources and display devices. A low voltage differential signaling (LVDS) signal protocol is often used in both unidirectional serial data channels and auxiliary channels of these digital display interfaces. Each signal channel includes a pair of differential signals, and each differential signal includes a respective common mode direct voltage (DC) signal and an alternating voltage (AC) signal coupled to the common mode DC signal. The differential signals of the same signal channel generates different common mode DC signals due to different pull-up and pull-down resistances, making it almost impossible to compare the differential signals of the same signal channel with a satisfactory accuracy level. Low-pass filters are used to filter the differential signals of the same signal channel separately to reduce rippling on the corresponding DC voltage signals, such that a comparator can detect the data signals on the signal channel. However, common mode in-phase noise still exists, and is difficult to cancel, in the differential signals of the signal channel, thereby compromising quality of display or control data that can be received and recovered via the signal channel. Thus, there is a need to apply a signal processing mechanism that can promptly recover audio, video, or other device management and device control data with data accuracy and signal fidelity in a display data interface (e.g., a display port).

SUMMARY

This application is directed to electronic systems, electronic devices, data links, data ports, and data interfaces that process a differential input signal with reference to a predefined reference voltage. Specifically, the differential input signal is filtered with a high pass filter to generate a filtered differential input signal. A differential integrator is further applied to receive the filtered differential input signal and generate a differential output signal including a first output signal and a second output signal. Each of the first and second output signals has a common mode output voltage substantially equal to the predefined reference voltage. By these means, common mode DC voltage levels of the differential input signals are controlled to suppress associated in-phase noise in a corresponding signal channel and facilitate processing of the data signals of the differential input signals in a prompt, accurate, and reliable manner.

In one aspect, an electronic device includes an input interface, a reference interface, a high pass filter, and a differential integrator. The input interface is configured to receive a differential input signal. The reference interface is configured to provide a predefined reference voltage. The high pass filter is coupled to the input interface and configured to filter the differential input signal and generate a filtered differential input signal. The differential integrator is coupled to the high pass filter and the reference interface and configured to receive the filtered differential input signal and generate a differential output signal including a first output signal and a second output signal. Each of the first and second output signals has a common mode output voltage substantially equal to the predefined reference voltage.

In some embodiments, the electronic device further includes a comparator coupled to the differential integrator. The comparator is configured to receive the differential output signal and generate an output digital signal from the differential output signal.

In some embodiments, the electronic device includes a connector including a plurality of data lanes and a pair of differential command pins distinct from the plurality of data lanes. The input interface is coupled to the pair of differential command pins for receiving the differential input signal. The differential input signal includes a serial data command configured to control data transmission via the plurality of data lanes of the connector.

In another aspect, an integrated data interface includes an input interface, a reference interface, a high pass filter, and a differential integrator. The input interface is configured to receive a differential input signal. The reference interface is configured to provide a predefined reference voltage. The high pass filter is coupled to the input interface and configured to filter the differential input signal and generate a filtered differential input signal. The differential integrator is coupled to the high pass filter and the reference interface and configured to receive the filtered differential input signal and generate a differential output signal including a first output signal and a second output signal. Each of the first and second output signals has a common mode output voltage substantially equal to the predefined reference voltage.

In yet another aspect, a method is implemented to provide a data interface. The method includes providing an input interface configured to receive a differential input signal and providing a reference interface configured to provide a predefined reference voltage. The method providing a high pass filter coupled to the input interface, and the high pass filter is configured to filter the differential input signal and generate a filtered differential input signal. The method further includes providing a differential integrator coupled to the high pass filter and the reference interface. The differential integrator is configured to receive the filtered differential input signal and generate a differential output signal including a first output signal and a second output signal, and each of the first and second output signals has a common mode output voltage substantially equal to the predefined reference voltage.

In another aspect, a method is implemented to process a differential input signal. The method includes obtaining a differential input signal and obtaining a predefined reference voltage. The method further includes filtering the differential input signal to generate a filtered differential input signal. The method further includes processing the filtered differential input signal to generate a differential output signal including a first output signal and a second output signal. Each of the first and second output signals has a common mode output voltage substantially equal to the predefined reference voltage.

These illustrative embodiments and embodiments are mentioned not to limit or define the disclosure, but to provide examples to aid understanding thereof. Additional embodiments are discussed in the Detailed Description, and further description is provided there.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

Like reference numerals refer to corresponding parts throughout the several views of the drawings.

DESCRIPTION OF EMBODIMENTS

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
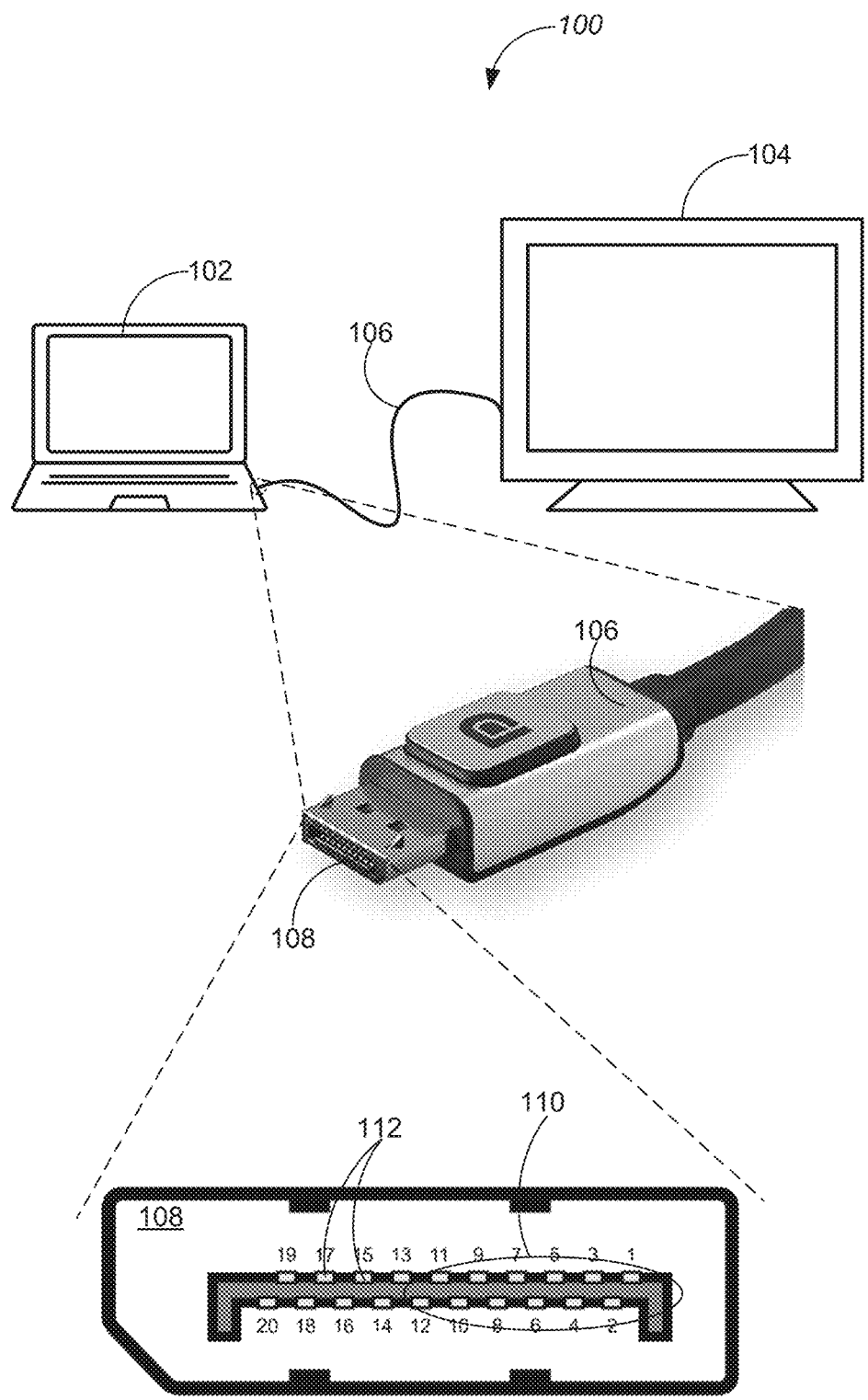
FIG. 1 is a block diagram of an example electronic system in which a video source is electrically coupled to a display device via a display data link, in accordance with some embodiments.

FIG. 1 is a block diagram of an example electronic system 100 in which a video source 102 is electrically coupled to a display device 104 via a display data link 106, in accordance with some embodiments. The display device 104 has a screen configured to display visual content. The video source 102 is designed to provide the visual content to be displayed on the screen of the display device 104. Examples of the video source 102 include, but are not limited to, a desktop computer, a laptop computer, a tablet computer, a video player, a camera device, a gameplayer device, or other formats of electronic devices which are configured to cause the visual content to be displayed on the screen the display device 104. The video source 102 and the display device 104 are physical coupled via the display data link 106. Video data, audio data, and control data are transmitted from the video source 102 to the display device 104 via the display data link 106.

The display data link 106 includes two connectors 108 at two of its ends. The two connectors 108 are configured to connect display data link 106 to respective connectors of the video source 102 and display device 104, respectively. For example, the display data link 106 includes a DisplayPort connector 108 having a digital display interface developed by a consortium of personal computer and chip manufacturers and standardized by the Video Electronics Standards Association (VESA). The DisplayPort connector 108 is configured to connect the display data link 106 to the video source 102 and carry video, audio, and control data according to a data communication protocol.

In some embodiments, the connector 108 includes a plurality of data lanes 110 and a pair of differential command pins 112 distinct from the plurality of data lanes 110. The pair of differential command pins 112 are configured to receive a differential input signal (e.g., including a first input signal 210A and a second input signal 210B in FIG. 3) from the video source 102, and the differential input signal carries a serial data command configured to control data transmission via the plurality of data lanes 110 of the connector 108. In some embodiments, the pair of differential command pins 112 of the connector 108 is associated with an auxiliary channel. The plurality of data lanes 110 of the connector 108 are unidirectional from the video source 102 to the display device 104. Conversely, the auxiliary channel of the connector 108 is a bidirectional data channel used for communication of additional serial data beyond video and audio data, such as consumer electronics control (CEC) commands. In some embodiments, the pair of differential command pins 112 is coupled to a dedicated set of twisted-pair wires configured to carry two input signals of the differential input signal.

In some embodiments, the display data link 106 further includes a receiver circuit coupled to the display device 104. The receiver circuit is configured to receive the differential input signal via the pair of differential command pins 112 of the display data link 106 and generate an output digital signal carrying the serial data that is carried by the differential input signal.

Figure 2:
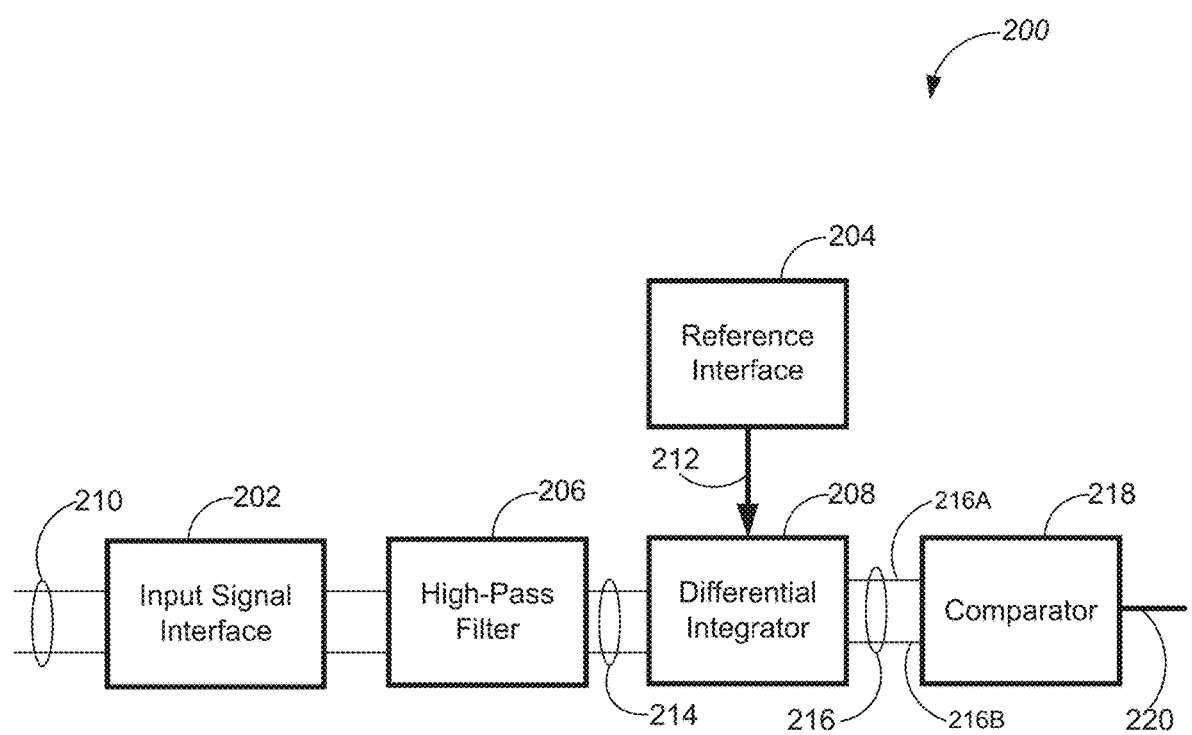
FIG. 2 is a block diagram of an example receiver circuit of an electronic system 100, in accordance with some embodiments.

FIG. 2 is a block diagram of an example receiver circuit 200 of an electronic system 100, in accordance with some embodiments. The receiver circuit 200 is included in a display data link 106. The receiver circuit 200 includes an input interface 202, a reference interface 204, a high pass filter 206, and a differential integrator 208. The input interface 202 is configured to receive a differential input signal 210. The reference interface 204 is configured to provide a predefined reference voltage 212. The high pass filter 206 is coupled to the input interface 202, and configured to filter the differential input signal 210 and generate a filtered differential input signal 214. The differential integrator 208 is coupled to the high pass filter 206 and the reference interface 204, and configured to receive the filtered differential input signal 214 and generate a differential output signal 216 including a first output signal 216A and a second output signal 216B. Each of the first and second output signals 216A and 216B has a common mode output voltage substantially equal to the predefined reference voltage 212. In some embodiments, the receiver circuit 200 further includes a comparator 218 coupled to the differential integrator 208. The comparator 218 is configured to receive the differential output signal 216 and generate an output digital signal 220 from the differential output signal 216. In an example, the output digital signal 220 is a single-end digital signal, and has a duty cycle equal to 50%.

Figure 4:
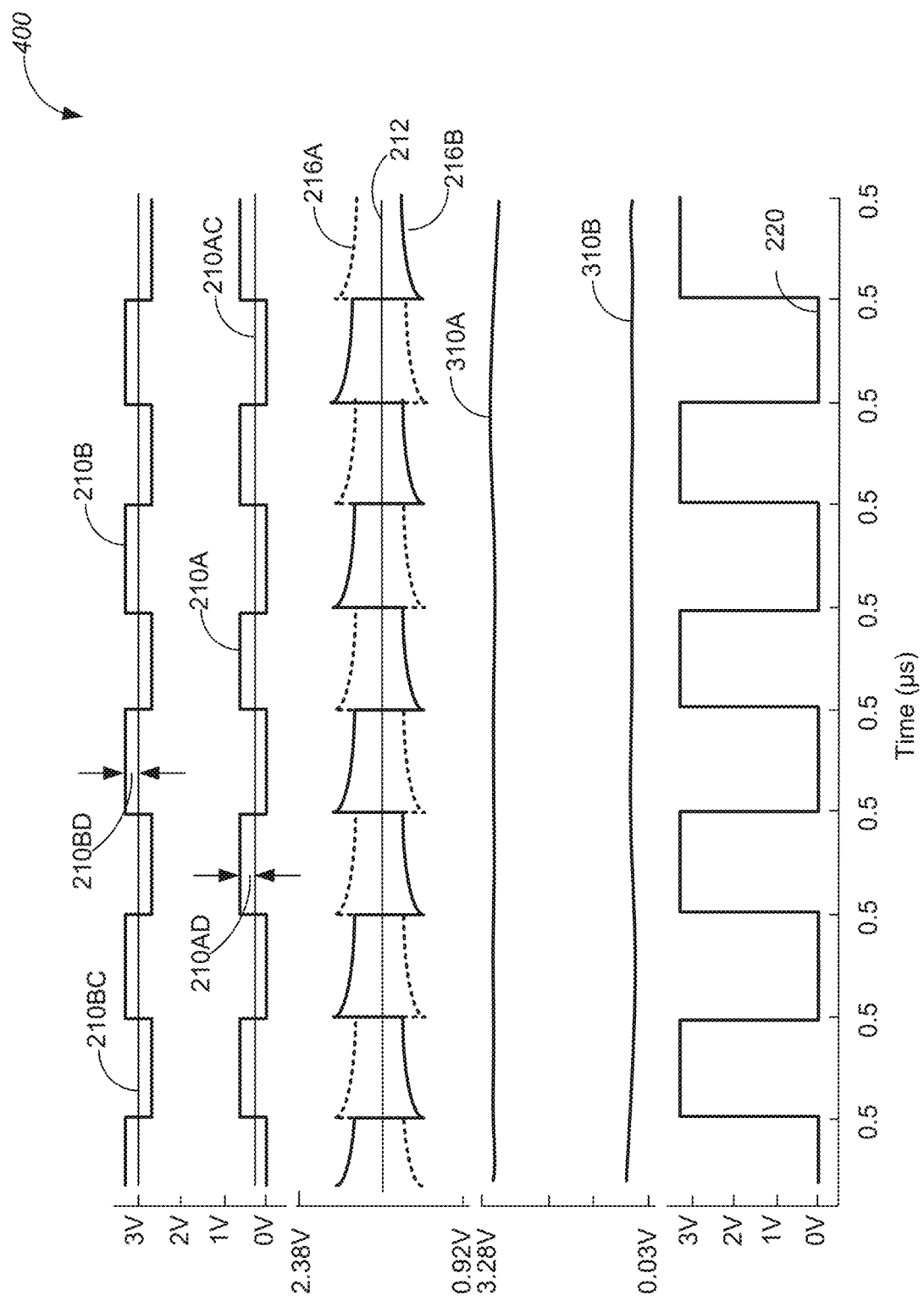
FIG. 4 is a set of temporal diagrams of a plurality of signals of a receiver circuit of an electronic system, in accordance with some embodiments.

In some embodiments, the differential input signal 210 includes a first input signal 210A having a first common mode voltage 210AC and a second input signal 210B having a second common mode voltage 210BC that is distinct from the first common mode voltage 210AC. Further, in some embodiments, the first input signal 210A includes a first data signal 210AD, and the second input signal 210B includes a second data signal 210BD (FIG. 4). For example, each of the first and second data signals 210AD and 210BD includes a respective AC signal. The first and second data signals 210AD and 210BD are applied to carry digital serial data to be recovered from the differential input signal 210. The input interface 202 is configured to receive the differential input signal 210 including the common mode voltage and data signal of each of the first and second input signals 210A and 210B.

In some situations, the common mode voltages 210AC and 210BC of the first and second input signals 210A and 210B are identical (e.g., stay at the same common mode voltage and change in a synchronous manner) and cancel each other. The output digital signal 220 is generated to recover the digital serial data carried by a difference of the first and second data signals 210AD and 210BD of the differential input signal 210. Alternatively, in some situations, the common mode voltages 210AC and 210BC of the first and second input signals 210A and 210B change gradually around the same common mode level in an asynchronous manner or correspond to two distinct common model levels. A difference of the first and second common mode voltages 210AC and 210BC is controlled and compensated, when the predefined reference voltage 212 is provided to control operation of the differential integrator 208. By these means, the output digital signal 220 may accurately recover the digital serial data carried in the difference of the first and second data signals 210AD and 210BD without being compromised by a difference of the first and second common model voltages 210AC and 210BC. The difference of the common model voltages 210AC and 210BC optionally includes a low frequency asynchronous variation of the difference.

Figure 3:
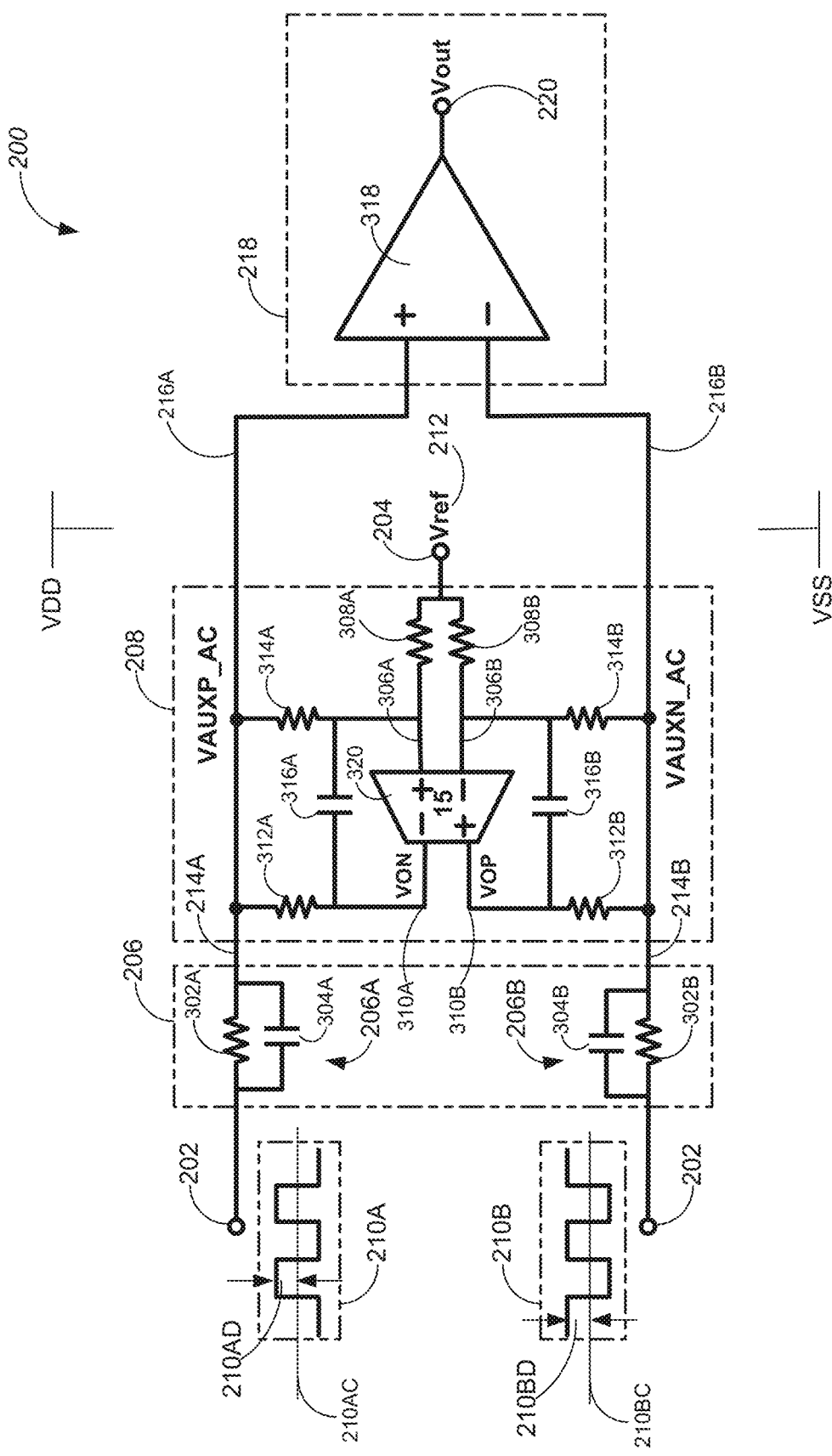
FIG. 3 is a block diagram of another example receiver circuit of an electronic system 100, in accordance with some embodiments.

FIG. 3 is a block diagram of another example receiver circuit 200 of an electronic system 100, in accordance with some embodiments. The receiver circuit 200 includes an input interface 202, a reference interface 204, a high pass filter 206, a differential integrator 208, and a comparator 218. Exemplary implementations of each of the high pass filter 206, differential integrator 208, and comparator 218 are shown in FIG. 3. The input interface 202 is configured to receive a differential input signal 210 including a first input signal 210A and a second input signal 210B. The high pass filter 206 is configured to filter the differential input signal 210 and generate a filtered differential input signal 214 (including a first filtered input signal 214A and a second filtered input signal 214B). The reference interface 204 is configured to provide a predefined reference voltage 212. The differential integrator 208 is configured to receive the filtered differential input signal 214 and the predefined reference voltage 212, and generate a differential output signal 216 including a first output signal 216A and a second output signal 216B. Each of the first and second output signals 216A and 216B has a common mode output voltage substantially equal to the predefined reference voltage 212.

In some embodiments, a comparator 218 is coupled to the differential integrator 208. The comparator 218 is configured to receive the differential output signal 216 and generate an output digital signal 220 from the differential output signal 216. In an example, the output digital signal 220 is a single-end digital signal between two power rails (e.g., corresponding to power supplies VDD and VSS), and recovers serial data that are carried by the differential input signal 210. Further, in some embodiments, the comparator 218 includes an operational amplifier 318 that is not coupled to any feedback. Based on a large gain of the operational amplifier 318 (e.g., greater than 50 dB), the comparator 218 effectively enhances detection sensitivity and reliability of the receiver circuit 200.

In some embodiments, the high pass filter 206 includes a first filter 206A and a second filter 206B. The first and second filters 206A and 206B are configured to filter low frequency noise of the first and second input signals 210A and 210B to generate the first and second filtered input signals 214A and 214B, respectively. In an example, the first filter 206A includes a resistor 302A and a capacitor 304A coupled in parallel with the resistor 302A, and the second filter 206B includes a resistor 302B and a capacitor 304B coupled in parallel with the resistor 302B. The resistor 302B has the same resistance as the resistor 302A, and the capacitor 304B has the same capacitance as the capacitor 304A. In some embodiments, the capacitors 304A and 304B removed from the high pass filter 206, and a differential data signal corresponding to an AC swing of the differential input signal 210 is attenuated, e.g., by half.

In some embodiments, the high pass filter 206 has a characteristic frequency above which the filtered differential input signal 214 goes beyond a predefined portion of, and reaches, the differential input signal 210. Below the characteristic frequency of the high pass filter 206, the filtered differential input signal 214 is controlled below the predefined portion of the differential input signal 210 and drops to a zero level. In an example, the characteristic frequency of the high pass filter 206 includes a cutoff frequency at which the filtered differential input signal 214 is equals 70.7% of the differential input signal 210. The first input signal 210A further includes a first data signal 210AD modulating a first common mode voltage 210AC, and the second input signal 210B further includes a second data signal 210BD modulating the second common mode voltage 210BC. In some embodiments, the first data signal 210AD and the second data signal 210BD form a differential data signal, e.g., corresponding to an AC swing of the differential input signal 210. The differential data signal is configured to carry digital serial data to be communicated via the receiver circuit 200, and has a data frequency that is higher than the characteristic frequency of the high pass filter 206. Stated another way, the characteristic frequency of the high pass filter 206 is designed to be lower than the data frequency of the differential data signal of the differential input signal 210, such that the differential data signal corresponding to the AC swing of the differential input signal 210 passes the high pass filter 206 with no or little attenuation, thereby allowing the receiver circuit 200 to be balanced quickly.

Further, in some situations, the second input signal 210B remains substantially constant, and the second data signal 210BD is substantially equal to zero. The second data signal 210BD is zero, and the first data signal 210AD forms the differential data signal having a data frequency that is higher than the characteristic frequency of the high pass filter. As such, the differential data signal passes the high pass filter 206, while a difference of the first and second common mode voltages 210AC and 210BC (e.g., including its low frequency variation) is reduced or suppressed in the differential output signal 216 by way of applying the high pass filter 206.

In some embodiments, the differential integrator 208 includes a differential input and differential output amplifier 320 (also called a fully differential amplifier) having a first amplifier input 306A and a second amplifier input 306B. Each of the first and second amplifier inputs 306A and 306B is coupled to the reference interface 204 by at least a resistor 308A or 308B. For example, the first amplifier input 306A is coupled to the reference interface 204 by the resistor 308A, and the second amplifier input 306B is coupled to the reference interface 204 by the resistor 308B having the same resistance as the resistor 308A. A first amplifier output 310A and a second amplifier output 310B are coupled to the first amplifier input 306A and second amplifier input 306B via two identical feedback networks, respectively. Each feedback network of the amplifier 320 includes a first resistor 312A or 312B, a second resistor 314A or 314B, and a capacitor 316A or 316B. The first resistor 312A is coupled between the first filter 206A of the high pass filter 206 and the amplifier output 310A of the amplifier 320, and the first resistor 312B is coupled between the second filter 206B of the high pass filter 206 and the amplifier output 310B of the amplifier 320. The second resistor 314A is coupled between the first filter 206A of the high pass filter 206 and the amplifier input 306A of the amplifier 320, and the second resistor 314B is coupled between the second filter 206B of the high pass filter 206 and the amplifier input 306B of the amplifier 320. The capacitor 316A is coupled between the first amplifiers input 306A and output 310A, and the capacitor 316B is coupled between the second amplifiers input 306B and output 310B.

In some embodiments, the fully differential amplifier 320 includes a rail-to-rail operational amplifier. An integration function of the differential integrator 208 suppresses an offset of the receiver circuit 200, which is caused by different common mode voltages of the first and second input signals 210A and 210B of the differential input signal 210 and/or their asynchronous low frequency variation.

As explained above, the first input signal 210A further includes a first data signal 210AD modulating a first common mode voltage 210AC, and the second input signal 210B further includes a second data signal 210BD modulating the second common mode voltage 210BC. The first data signal 210AD and the second data signal 210BD form a differential data signal. In some embodiments, the first resistors 312A and 312B, second resistors 314A and 314B, capacitors 316A and 316B, and resistors 308A and 308B are selected to make the differential integrator 208 to provide a unity gain to buffer the differential data signal of the input signals 210A and 210B of the differential input signal 210. Further, the first resistors 312A and 312B, second resistors 314A and 314B, and resistors 308A and 308B form a resistor voltage distribution network associated with the differential integrator 208. The high pass filter 206 is configured to avoid an amplitude attenuation of the differential data signal carried by the differential output signal 216, as the filtered differential input signal 214 and differential output signal 216 are both coupled to the resistor voltage distribution network.

It is noted that, in some embodiments, the high pass filter 206 is configured to reduce a difference of the first and second common mode voltages 210AC and 210BC of the differential input signal 210 without impacting the differential data signal (i.e., an AC swing) of the differential input signal 210. In some situations, the high pass filter 206 substantially suppresses (i.e., cancels) the difference of the first and second common mode voltages 210AC and 210BC of the differential input signal 210. The high pass filter 206 enables such offset cancellation jointly with the resistor voltage distribution network of the differential integrator 208.

Further, the predefined reference voltage 212 is used to provide the differential integrator 310 with a common mode level to which common mode output voltages of both of the differential output signals are set. In some embodiments, the receiver circuit 200 is powered by a high supply voltage VDD and a low supply voltage VSS, and the predefined reference voltage 212 is an average of the high and low supply voltages VDD and VSS. Alternatively, in some embodiments, the predefined reference voltage 212 is an average of the first and second common mode voltages 210AC and 210BC of the first and second input signals 210A and 210B of the differential input signal 210.

In some embodiments, an electronic device includes a connector 108 (FIG. 1) including a plurality of data lanes 110 and a pair of differential command pins 112 distinct from the plurality of data lanes 110. The connector 108 is coupled to the receiver circuit 200 (e.g., in a display data link 106 or display device 104). The input interface 202 is coupled to the pair of differential command pins 112 for receiving the differential input signal 210. The differential input signal 210 includes a serial data command configured to control data transmission via the plurality of data lanes 110 of the connector 108. An example of the connector 108 is a DisplayPort connector that complies with an embedded display port communication protocol. By these means, the receiver circuit 200 avoids common mode noise or change at an input interface 202, thereby guaranteeing that auxiliary commands received via the differential command pins 112 will be processed correctly.

FIG. 4 is a set of temporal diagrams 400 of a plurality of signals of a receiver circuit 200 of an electronic system 100, in accordance with some embodiments. The plurality of signals include a first input signal 210A and a second input signal 210B of a differential input signal 210, a first output voltage 216A and a second output voltage 216B of the differential output signal 216, a first amplifier output 310A and a second amplifier output 310B of the amplifier 320 of the differential integrator 208, and an output digital signal 220. The first input signal 210A is a combination of a first common mode voltage 210AC and the first data signal 210AD, and the second input signal 210B is a combination of a second common model voltage 210BC (not shown) and the second data signal 210BD. The first input signal 210A and the second input signal 210B of the differential input signal 210 are provided to an input interface 202, and filtered by a high pass filter 206 to generate a filtered differential input signal 214. A differential integrator 208 converts the filtered differential input signal 214 to a differential output signal 216, which is processed by a comparator 218 to generate the output digital signal 220.

Referring to FIG. 4, in this example, the first and second amplifier outputs 310A and 310B of the amplifier 320 of the differential integrator 208 vary around 0.3V and 3.0V, respectively. The first and second common mode voltages 210AC and 210BC are equal to 0.3V and 3.0V, respectively. Both of the first and second data signals 210AD and 210BD have amplitudes of 0.6V. The predefined reference voltage 212 is set to be an average of the first and second common mode voltages 210AC and 210BC, e.g., substantially equal to 1.65V. Common mode output voltages of the first and second output voltages 216A and 216B of the differential output signal 216 are stabilized with reference to the predefined reference voltage 212. The comparator 218 includes a high sensitivity comparator configured to switch in response to a difference of the first and second output voltages 216A and 216B of the differential output signal 216. The difference of the first and second output voltages 216A and 216B of the differential output signal 216 corresponds to a difference of the data signals 210AD and 210BD, because a difference of the common mode voltages 210AC and 210BC are controlled or suppressed by application of the receiver circuit 200. As such, the output digital signal 220 accurately reflects the difference of the data signals 210AD and 210BD of the first and second output voltages 216A and 216B of the differential output signal 216, thereby providing an accurate recovery of the serial digital data carried by the differential input signal 210.

In some embodiments not shown, serial data is carried on the second input signal 210B. The first data signal 210AD of the differential input signal 210 is zero, and the second data signal 210BD of the differential input signal 210 is not equal to zero. Alternatively, in some embodiments not shown, serial data is carried on the first input signal 210A. The first data signal 210AD of the differential input signal 210 is not equal to zero, and the second data signal 210BD of the differential input signal 210 is zero. In some embodiments not shown, the first and second common mode voltages 210AC and 210BC are equal to each other, e.g., remain at 3V or above, which is substantially close to a high supply voltage VDD of 3.3V. Alternatively, in some embodiments not shown, the first and second common mode voltages 210AC and 210BC are equal to each other, e.g., remain at 0.3V or below, which is substantially close to a low supply voltage VDD of 0V. Alternatively and additionally, in some embodiments (FIG. 4), the first and second common mode voltages 210AC and 210BC are close to two opposite power supplies VSS and VDD, respectively.

Figure 5:
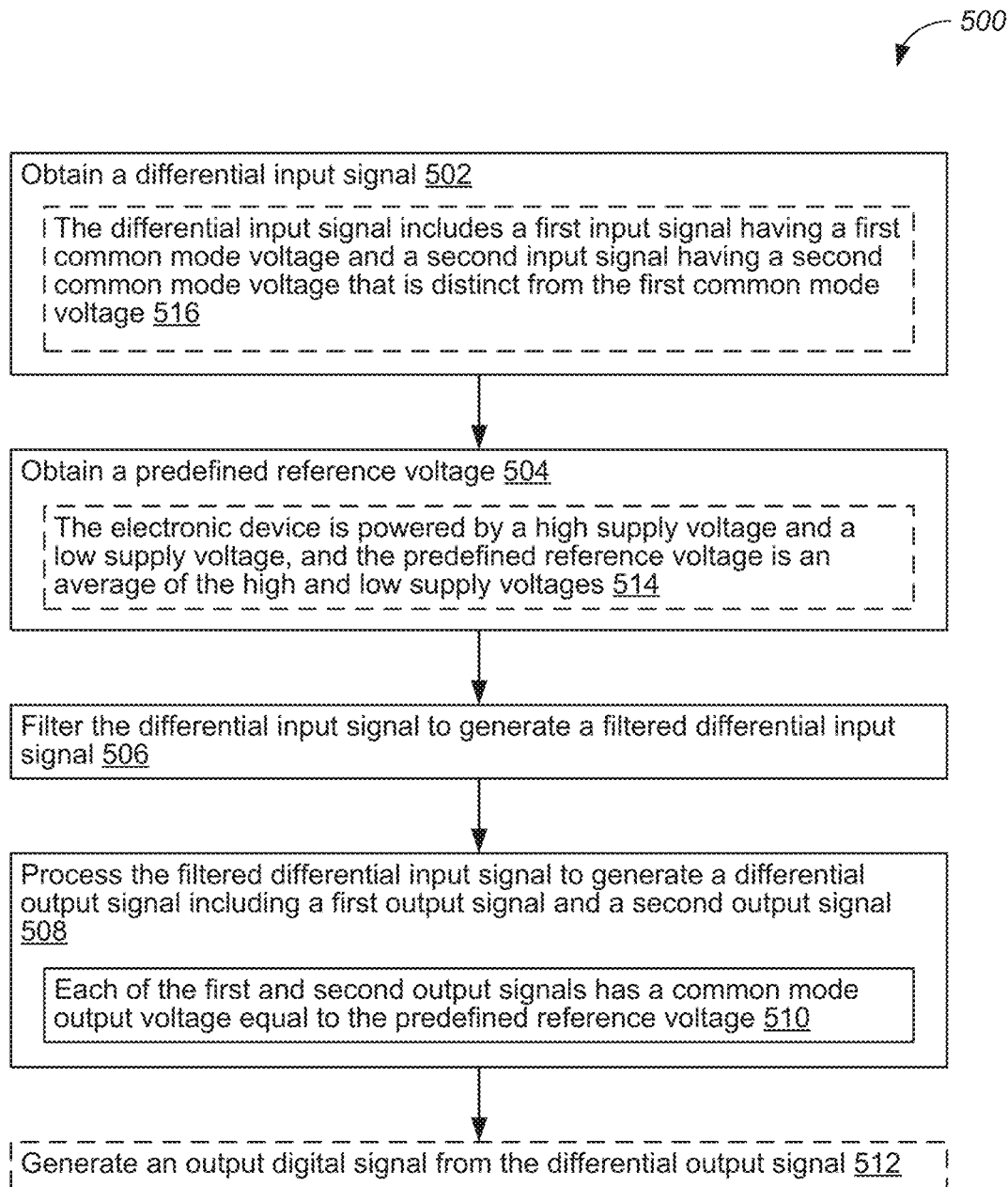
FIG. 5 is a flow diagram of an example method of processing a differential input signal at a data interface, in accordance with some embodiments.

FIG. 5 is a flow diagram of an example method 500 of processing a differential input signal 210 at a data interface, in accordance with some embodiments. The method 500 is implemented by an electronic device (e.g., a receiver circuit 200 of a display port). The electronic device obtains a differential input signal 210 (502) and a predefined reference voltage 212 (504), e.g., by an input interface 202 and a reference interface 204, respectively. The electronic device filters (506) the differential input signal 210 to generate a filtered differential input signal 214, e.g., by a high pass filter 206. The electronic device processes (508) the filtered differential input signal 214 to generate a differential output signal 216 including a first output signal 216A and a second output signal 216B, e.g., by a differential integrator 208. Each of the first and second output signals 216A and 216B has (510) a common mode output voltage equal to the predefined reference voltage 212. In some embodiments, the differential integrator 208 provides a unity gain to buffer a differential data signal of the differential input signal 210 (e.g., a difference of data signals 210AD and 210BD of the first and second input signals 210A and 210B). In some embodiments, the electronic device generates (512) an output digital signal 220 from the differential output signal 216, e.g., by a comparator 218 coupled to the differential integrator 208.

In some embodiments, the electronic device includes a connector 108 (e.g., a DisplayPort connector) including a plurality of data lanes 110 and a pair of differential command pins 112 distinct from the plurality of data lanes 110. The input interface 202 is coupled to the pair of differential command pins 112 for receiving the differential input signal 210. The differential input signal 210 includes a serial data command configured to control data transmission via the plurality of data lanes 110 of the connector 108.

In some embodiments, the electronic device is powered (514) by a high supply voltage VDD and a low supply voltage VSS, and the predefined reference voltage 212 is an average of the high and low supply voltages VDD and VSS.

In some embodiments, the differential input signal 210 includes (516) a first input signal 210A having a first common mode voltage 210AC and a second input signal having a second common mode voltage 210BC that is distinct from the first common mode voltage 210AC. Further, in some embodiments, the predefined reference voltage 212 is an average of the first and second common mode voltages 210AC and 210B. Additionally, in some embodiments, the electronic device reduces a corresponding difference of the first and second common mode voltages 210AC and 210BC in the differential input signal 210 based on a characteristic frequency. In some embodiments, the first common mode voltage 210AC is equal to the second common mode voltage 210BC. Conversely, in some embodiments, the first common mode voltage 210AC is not equal to the second common mode voltage 210BC. In an example, a difference of the first and second common mode voltages 210AC and 210BC is greater than a threshold voltage.

In some embodiments, the high pass filter 206 of the electronic device includes a first filter 206A and a second filter 206B. The electronic device filters low frequency noise of the first and second input signals of the differential input signal 210 by the first and second filters 206A and 206B, respectively. Each of the first and second filters 206A and 206B includes a resistor and a capacitor coupled in parallel with the resistor.

In some embodiments, the first input signal 210A further includes a first data signal 210AD modulating the first common mode voltage 210AC, and the second input signal further includes a second data signal 210BD modulating the second common mode voltage 210BC. The first data signal 210AD and the second data signal 210BD form a differential data signal having a data frequency that is higher than a characteristic frequency of the high pass filter 206 that filters the differential input signal 210.

In some embodiments, the first input signal 210A further includes a first data signal 210AD modulating the first common mode voltage 210AC. The second input signal 210B remains substantially constant. The first data signal 210AD forms a differential data signal having a data frequency that is higher than a characteristic frequency of the high pass filter 206 that that filters the differential input signal 210.

In some embodiments, the differential integrator 208 includes a differential input and differential output amplifier 320 (also called a fully differential amplifier) having a first amplifier input 306A and a second amplifier input 306B. The first and second amplifier inputs 306A and 306B are coupled to the reference interface 204 by a first resistor 308A and a second resistor 308B, respectively. The second resistor 308B has the same resistance as the first resistor 308A.

Figure 6:
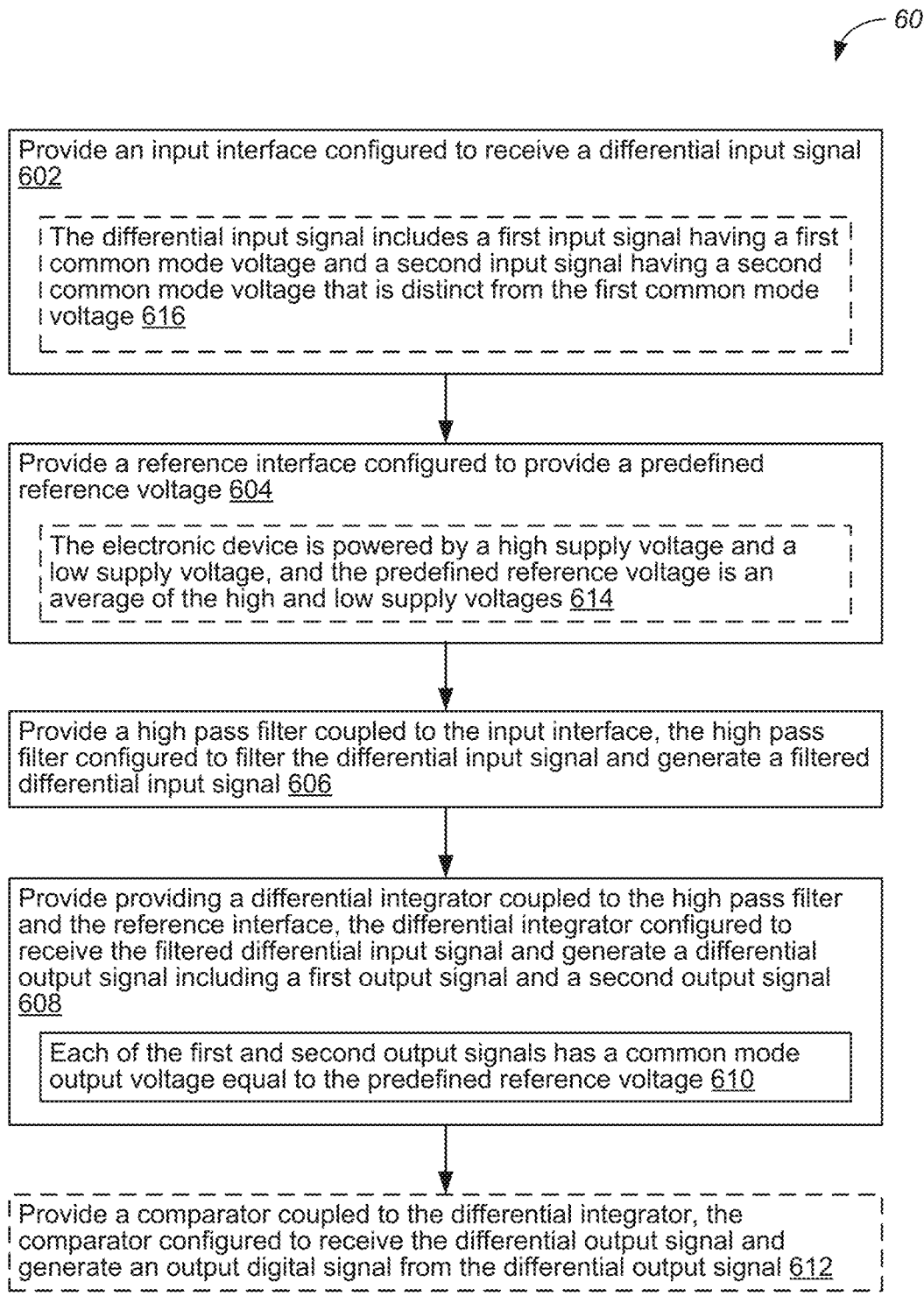
FIG. 6 is a flow diagram of an example method of providing a data interface for processing a differential input signal, in accordance with some embodiments.

FIG. 6 is a flow diagram of an example method 600 of providing a data interface for processing a differential input signal 210, in accordance with some embodiments. In accordance with the method 600, an input interface 202 is provided (602) to receive a differential input signal 210, and a reference interface 204 is provided (604) to provide a predefined reference voltage 212. A high pass filter 206 is provided (606) to be coupled to the input interface 202. The high pass filter 206 is configured to filter the differential input signal 210 and generate a filtered differential input signal 214. A differential integrator 208 is provided (608) to be coupled to the high pass filter 206 and the reference interface 204. The differential integrator 208 is configured to receive the filtered differential input signal 214 and generate a differential output signal 216 including a first output signal 216A and a second output signal 216B. Referring to FIG. 4, each of the first and second output signals 216A and 216B has (610) a common mode output voltage substantially equal to the predefined reference voltage 212.

In some embodiments, a comparator 218 is provided (612). The comparator 218 is coupled to the differential integrator 208, and configured to receive the differential output signal 216 and generate an output digital signal 220 from the differential output signal 216.

In some embodiments, the electronic device is powered (614) by a high supply voltage VDD and a low supply voltage VSS, and the predefined reference voltage 212 is an average of the high and low supply voltages VDD and VSS.

In some embodiments, the differential integrator 208 is configured to provide a unity gain to buffer a differential data signal of the differential input signal 210.

In some embodiments, the electronic device includes a connector 108 (e.g., a DisplayPort connector) including a plurality of data lanes 110 and a pair of differential command pins 112 distinct from the plurality of data lanes 110. The input interface 202 is coupled to the pair of differential command pins 112 for receiving the differential input signal 210. The differential input signal 210 includes a serial data command configured to control data transmission via the plurality of data lanes 110 of the connector 108.

In some embodiments, the differential input signal 210 includes (616) a first input signal 210A having a first common mode voltage 210AC (FIG. 4) and a second input signal 210B having a second common mode voltage 210BC (FIG. 4) that is distinct from the first common mode voltage 210AC. Further, in some embodiments, the predefined reference voltage 212 is an average of the first and second common mode voltages 210AC and 210BC. Additionally, in some embodiments, the high pass filter 206 corresponds to a characteristic frequency, and the high pass filter 206 is configured to reduce a corresponding difference of the first and second common mode voltages 210AC and 210BC in the differential input signal 210 based on the characteristic frequency. The difference of the common model voltages 210AC and 210BC optionally includes a low frequency asynchronous variation of the difference.

In some embodiments, the high pass filter 206 includes a first filter 206A and a second filter 206B. The first and second filters 206A and 206B are configured to filter low frequency noise of the first and second input signals 210A and 210B of the differential input signal 210, respectively. Each of the first and second filters 206A and 206B includes a resistor 302 and a capacitor 304 coupled in parallel with the resistor 302.

In some embodiments, the first input signal 210A further includes a first data signal 210AD modulating the first common mode voltage 210AC. The second input signal 210B further includes a second data signal 210BD modulating the second common mode voltage 210BC. The first data signal 210AD and the second data signal 210BD form a differential data signal having a data frequency that is higher than a characteristic frequency of the high pass filter 206.

In some embodiments, the first input signal 210A further includes a first data signal 210AD modulating the first common mode voltage 210AC. The second input signal 210B remains substantially constant. The first data signal 210AD forms a differential data signal having a data frequency that is higher than a characteristic frequency of the high pass filter 206.

In some embodiments, the first common mode voltage 210AC is equal to the second common mode voltage 210BC. Conversely, in some embodiments, the first common mode voltage 210AC is not equal to the second common mode voltage 210BC. In an example, a difference of the first and second common mode voltages 210AC and 210BC is greater than a threshold voltage.

In some embodiments, providing the differential integrator 208 includes providing a differential input and differential output amplifier 320. The differential input and differential output amplifier 320 has a first amplifier input 306A and a second amplifier input 306B. The first and second amplifier inputs 306A and 306B are coupled to the reference interface 204 by a first resistor 308A and a second resistor 308B, respectively. The second resistor 308B has the same resistance as the first resistor 308A.

It should be understood that the particular order in which the operations in each of FIGS. 5 and 6 have been described are merely exemplary and are not intended to indicate that the described order is the only order in which the operations could be performed. One of ordinary skill in the art would recognize various ways to providing an electronic device for processing a differential input signal 210 as described herein. Additionally, it should be noted that details of other processes and structures described above with respect to FIGS. 1-4 are also applicable in an analogous manner to method 500 or 600 described above with respect to FIG. 5 or 6. For brevity, these details are not repeated here.

It will also be understood that, although the terms first, second, etc. are, in some instances, used herein to describe various elements, these elements should not be limited by these terms. These terms are only used to distinguish one element from another. For example, a first electronic device can be termed a second electronic device, and, similarly, a second electronic device can be termed a first electronic device, without departing from the scope of the various described embodiments. The first electronic device and the second electronic device are both electronic device, but they are not the same electronic device.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof.

The above description, for purpose of explanation, has been described with reference to specific embodiments. However, the illustrative discussions above are not intended

What is claimed is:

1. An electronic device, comprising:
an input interface configured to receive a differential input signal carrying digital serial data;
a reference interface configured to provide a predefined reference voltage;
a high pass filter coupled to the input interface, the high pass filter configured to filter the differential input signal and generate a filtered differential input signal;
a differential integrator coupled to the high pass filter and the reference interface, the differential integrator configured to receive the filtered differential input signal and generate a differential output signal including a first output signal and a second output signal, each of the first and second output signals having a common mode output voltage substantially equal to the predefined reference voltage;
a comparator including an operational amplifier, the comparator coupled to the differential output signal of the differential integrator, wherein the operational amplifier has no feedback and is configured to convert the first output signal and the second output signal, which share the common mode output voltage, to an output digital signal that recovers the digital serial data carried by the differential input signal; and
a connector including a plurality of data lanes and a pair of differential command pins, the pair of differential command pins distinct from the plurality of data lanes and coupled to the input interface, wherein:
the input interface receives the differential input signal via the pair of differential command pins; and
the differential input signal includes a serial data command configured to control data transmission via the plurality of data lanes of the connector.

2. The electronic device of claim 1, wherein the electronic device is powered by a high supply voltage and a low supply voltage, and the predefined reference voltage is an average of the high and low supply voltages.

3. The electronic device of claim 1, wherein the differential integrator is configured to provide a unity gain to buffer a differential data signal of the differential input signal.

4. The electronic device of claim 1, wherein the differential input signal includes a first input signal having a first common mode voltage and a second input signal having a second common mode voltage that is distinct from the first common mode voltage.

5. The electronic device of claim 4, wherein the predefined reference voltage is an average of the first and second common mode voltages.

6. The electronic device of claim 4, wherein the high pass filter corresponds to a characteristic frequency, and the high pass filter is configured to reduce a corresponding difference of the first and second common mode voltages in the differential input signal based on the characteristic frequency.

7. The electronic device of claim 4, wherein:
the high pass filter includes a first filter and a second filter;
the first and second filters are configured to filter low frequency noise of the first and second input signals of the differential input signal, respectively; and
each of the first and second filters includes a resistor and a capacitor coupled in parallel with the resistor.

8. The electronic device of claim 4, wherein:
the first input signal further includes a first data signal modulating the first common mode voltage;
the second input signal further includes a second data signal modulating the second common mode voltage; and
the first data signal and the second data signal form a differential data signal having a data frequency that is higher than a characteristic frequency of the high pass filter.

9. The electronic device of claim 4, wherein:
the first input signal further includes a first data signal modulating the first common mode voltage;
the second input signal remains substantially constant; and
the first data signal forms a differential data signal having a data frequency that is higher than a characteristic frequency of the high pass filter.

10. The electronic device of claim 4, wherein the first common mode voltage is equal to the second common mode voltage.

11. The electronic device of claim 4, wherein the first common mode voltage is not equal to the second common mode voltage.

12. The electronic device of claim 11, wherein a difference of the first and second common mode voltages is greater than a threshold voltage.

13. The electronic device of claim 1, wherein the differential integrator includes a differential input and differential output amplifier having a first amplifier input and a second amplifier input, and each of the first and second amplifier inputs is coupled to the reference interface by at least a resistor.

14. An integrated data interface of an electronic device, comprising:
an input interface configured to receive a differential input signal carrying digital serial data;
a reference interface configured to provide a predefined reference voltage;
a high pass filter coupled to the input interface, the high pass filter configured to filter the differential input signal and generate a filtered differential input signal;
a differential integrator coupled to the high pass filter and the reference interface, the differential integrator configured to receive the filtered differential input signal and generate a differential output signal including a first output signal and a second output signal, each of the first and second output signals having a common mode output voltage substantially equal to the predefined reference voltage; and
a comparator including an operational amplifier, the comparator coupled to the differential output signal of the differential integrator, wherein the operational amplifier has no feedback and is configured to convert the first output signal and the second output signal, which share the common mode output voltage, to an output digital signal that recovers the digital serial data carried by the differential input signal; and
a connector including a plurality of data lanes and a pair of differential command pins, the pair of differential command pins distinct from the plurality of data lanes and coupled to the input interface, wherein:

the input interface receives the differential input signal via the pair of differential command pins; and the differential input signal includes a serial data command configured to control data transmission via the plurality of data lanes of the connector.

15. The integrated data interface of claim 14, wherein the electronic device is powered by a high supply voltage and a low supply voltage, and the predefined reference voltage is an average of the high and low supply voltages.

16. A method for providing a data interface, comprising:
providing an input interface configured to receive a differential input signal carrying digital serial data;
providing a reference interface configured to provide a predefined reference voltage;
providing a high pass filter coupled to the input interface, the high pass filter configured to filter the differential input signal and generate a filtered differential input signal;
providing a differential integrator coupled to the high pass filter and the reference interface, the differential integrator configured to receive the filtered differential input signal and generate a differential output signal including a first output signal and a second output signal, each of the first and second output signals having a common mode output voltage substantially equal to the predefined reference voltage; and
providing an operational amplifier coupled to the differential integrator, wherein the operational amplifier has no feedback and is configured to convert the first output signal and the second output signal, which share the common mode output voltage, to an output digital signal that recovers the digital serial data carried by the differential input signal; and
providing a connector including a plurality of data lanes and a pair of differential command pins, the pair of differential command pins distinct from the plurality of data lanes and coupled to the input interface, wherein:
the input interface receives the differential input signal via the pair of differential command pins; and
the differential input signal includes a serial data command configured to control data transmission via the plurality of data lanes of the connector.

17. The electronic device of claim 1, wherein the differential input signal is coupled to the predefined reference voltage via one or more resistive paths.

18. The electronic device of claim 1, wherein the electronic device is a DisplayPort connector that complies with an embedded display port communication protocol.

* * * * *